United States Patent
Meyers et al.

(10) Patent No.: US 10,788,899 B2
(45) Date of Patent: Sep. 29, 2020

(54) INFORMATION HANDLING SYSTEM MEMBRANE KEYBOARD OVERLAY

(71) Applicant: Dell Products L.P., Round Rock, TX (US)

(72) Inventors: David Michael Meyers, Round Rock, TX (US); Jason Scott Morrison, Chadron, NE (US)

(73) Assignee: Dell Products L.P., Round Rock, TX (US)

( * ) Notice: Subject to any disclaimer, the term of this patent is extended or adjusted under 35 U.S.C. 154(b) by 100 days.

(21) Appl. No.: 16/155,292

(22) Filed: Oct. 9, 2018

(65) Prior Publication Data

US 2020/0110470 A1 Apr. 9, 2020

(51) Int. Cl.
*H01H 13/76* (2006.01)
*G06F 3/023* (2006.01)
*G06F 3/02* (2006.01)
*G06F 3/044* (2006.01)

(52) U.S. Cl.
CPC .......... *G06F 3/023* (2013.01); *G06F 3/0202* (2013.01); *G06F 3/044* (2013.01)

(58) Field of Classification Search
CPC .......... G06F 3/023; G06F 3/0202; G06F 3/044
See application file for complete search history.

(56) References Cited

U.S. PATENT DOCUMENTS

| | | | |
|---|---|---|---|
| 8,797,268 B2 * | 8/2014 | Altman | G06F 1/1616 345/156 |
| 9,496,102 B2 | 11/2016 | Bates et al. | |
| 9,620,306 B2 | 4/2017 | Huang | |
| 2013/0271373 A1 | 10/2013 | Milhe et al. | |
| 2014/0284193 A1 * | 9/2014 | Chou | H01H 13/705 200/5 A |

* cited by examiner

*Primary Examiner* — Kwang-su Yang
(74) *Attorney, Agent, or Firm* — Zagorin Cave LLP; Robert W. Holland

(57) ABSTRACT

A keyboard translates key inputs to a touchscreen display disposed under the keyboard with the keys biased away from the touchscreen display by an elastic material that engages with the touchscreen display. The elastic material couples the keys to a lattice held within a frame and having a height of less than the frame. The keys extend to an input position if the lattice presses against the touchscreen display, such as by being held in place with magnetic attraction. The keys retract to within the lattice if the lattice is raised relative to the touchscreen display, the elastic material biasing the lattice upward away from the touchscreen display.

20 Claims, 6 Drawing Sheets

INFORMATION HANDLING SYSTEM MEMBRANE KEYBOARD OVERLAY

BACKGROUND OF THE INVENTION

Field of the Invention

The present invention relates in general to the information handling system input devices, and more particularly to an information handling system membrane keyboard overlay.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically accept end user inputs through keyboard keys and present outputs as visual images at a display. Conventional keyboards have keys disposed in standardized formats, such as QWERTY. Each keyboard key indicates an input of a key value when the key is depressed. Generally, keyboard keys travel downward to press against a membrane with the key travel distance providing physical feedback that depressing a key created an input. After a key depression, a key biasing mechanism returns the key to an upward position prepared for another depression. The physical feedback provided by key travel helps end users type at a rapid pace so that keyboard key inputs tend to offer an efficient input modality.

Conventional keyboards bias keys upwards with a rubber dome mechanism located under each key. Rubber domes tend to offer a consistent physical feedback generally accepted as normal by end users. One difficulty with keyboards having rubber dome biasing mechanisms is that vertical height of the keyboards make integration into a portable housing difficult. Generally portable information handling systems integrate a keyboard and a display to support end user interactions without external peripheral devices. For example, a typical portable information handling system has two separate housing portions rotationally coupled to each other by a hinge. A display integrates in one housing portion and rotates to an open position held vertically for an end user to view. A keyboard integrates in the other housing portion held horizontally below the display aligned to accept typed inputs from an end user viewing the display. Such an arrangement is often referred to as a clamshell mode. The display rotates to close over the keyboard when the information handling system is not in use. Integrating a rubber dome keyboard tends to increase the vertical height of the information handling system to accommodate the full movement of the keyboard keys.

A trend towards thinner and lighter portable information handling systems has resulted in a number of alternative types of integrated keyboards that have less travel than rubber dome keyboards. For example, smaller metal domes used instead of rubber domes provide resilient feedback with less travel. An even thinner solution is to remove the keyboard entirely and use a touchscreen that accepts touches at visually depicted keys as the inputs. Tablet information handling systems typically include a touchscreen and present a keyboard visually at the touchscreen to accept end user typed inputs. Recently, portable information handling systems with rotationally coupled housing portions include a display over both housing portions instead of including a physical keyboard over one housing portion. In the clamshell viewing mode, an end user is presented with a keyboard on a display having a horizontal disposition so that the end user makes keyed inputs at a touchscreen of the display. An advantage of this arrangement is that display portion is generally much thinner than a physical keyboard. Further, the end user can rotate the housing portions to a planar configuration and use the displays over both housing portions simultaneously as in a tablet mode.

A disadvantage to having dual displays over separate rotating housing portions is that end users tend to have difficulty typing inputs at a capacitive touch device that lacks physical feedback, such as moving keys. Generally, typing into a user interface presented at a touchscreen display is slower and less accurate for most end users. An alternative is to carry a peripheral keyboard in addition to the information handling system for use when typed inputs are needed; however, carrying a separate peripheral is inconvenient and often disruptive. One type of alternative keyboard physically rests on the touchscreen to make inputs by pressing keys against the touchscreen display. As with other peripheral keyboards, full-sized mechanical keyboard solutions are generally bulky and inconvenient to carry.

SUMMARY OF THE INVENTION

Therefore, a need has arisen for a system and method which supports keyed inputs having a physical, vertical motion at a portable information handling system with a selectively attached and removed keyboard.

In accordance with the present invention, a system and method are provided which substantially reduce the disadvantages and problems associated with previous methods and systems for making keyed inputs at a portable information handling system. Keyboard key positions move between withdrawn and extended positions by interaction of an elastic member coupling the key to a lattice having an opening for the key. Extended keys translate downward presses into inputs by touching at a touchscreen display disposed below the keyboard.

More specifically, a portable information handling system extends a touchscreen display across two rotationally coupled housing portions that rotate between closed, clamshell and tablet positions. In the clamshell position, a keyboard rests on one portion of the touchscreen display to translate key presses into touch inputs at the touchscreen display. The keyboard has a frame that rests on the touchscreen display about a perimeter of the keyboard. The frame supports a lattice having plural openings through which keys travel vertically. The keys interact with the lattice through an elastic member that has a length greater than the distance between each key and lattice supporting structure so that the elastic member forms a bend. The lattice has a neutral position above the touchscreen display so that the lattice, frame and key upper surfaces share a common plane, such as blending with a cover that integrates the lattice. For example, the bend of excess elastic member material helps support the lattice above the touchscreen display. If the lattice is pressed down to contact the touchscreen display, the movement of the lattice translates through the elastic members to move the keys upward to an extended position that accepts typed inputs as presses against the touchscreen display. Magnets integrated in the lattice attract to a ferromagnetic material disposed under the display to maintain the lattice in contact against the touchscreen display, thus keeping the keys biased to an extended position.

The present invention provides a number of important technical advantages. One example of an important technical advantage is that an elastomeric membrane forms a keyboard that extends keys to accept typed inputs to a touchscreen display and withdraws keys to blend into a cover that extends around the information handling system housing. An elastic member integrated between each key and a lattice supporting the keys biases the keys to a neutral position in which the keys blend with a cover that protects an information handling system. Creases formed in the cover allow the keyboard to rotate between a covering function for the external housing surface and a keyboard function that interacts with a touchscreen display of the housing inner surface. An end user readily selects to interact with the information handling system through dual touchscreen display portions or to rotate the keyboard into position over one display portion, extend the keys, and type inputs to the touchscreen display for a convenient mechanical keyboard operation.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system keyboard keys move between an extended position that accepts inputs translated to a touchscreen display and a withdrawn position that blends the keys into a flexible cover. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
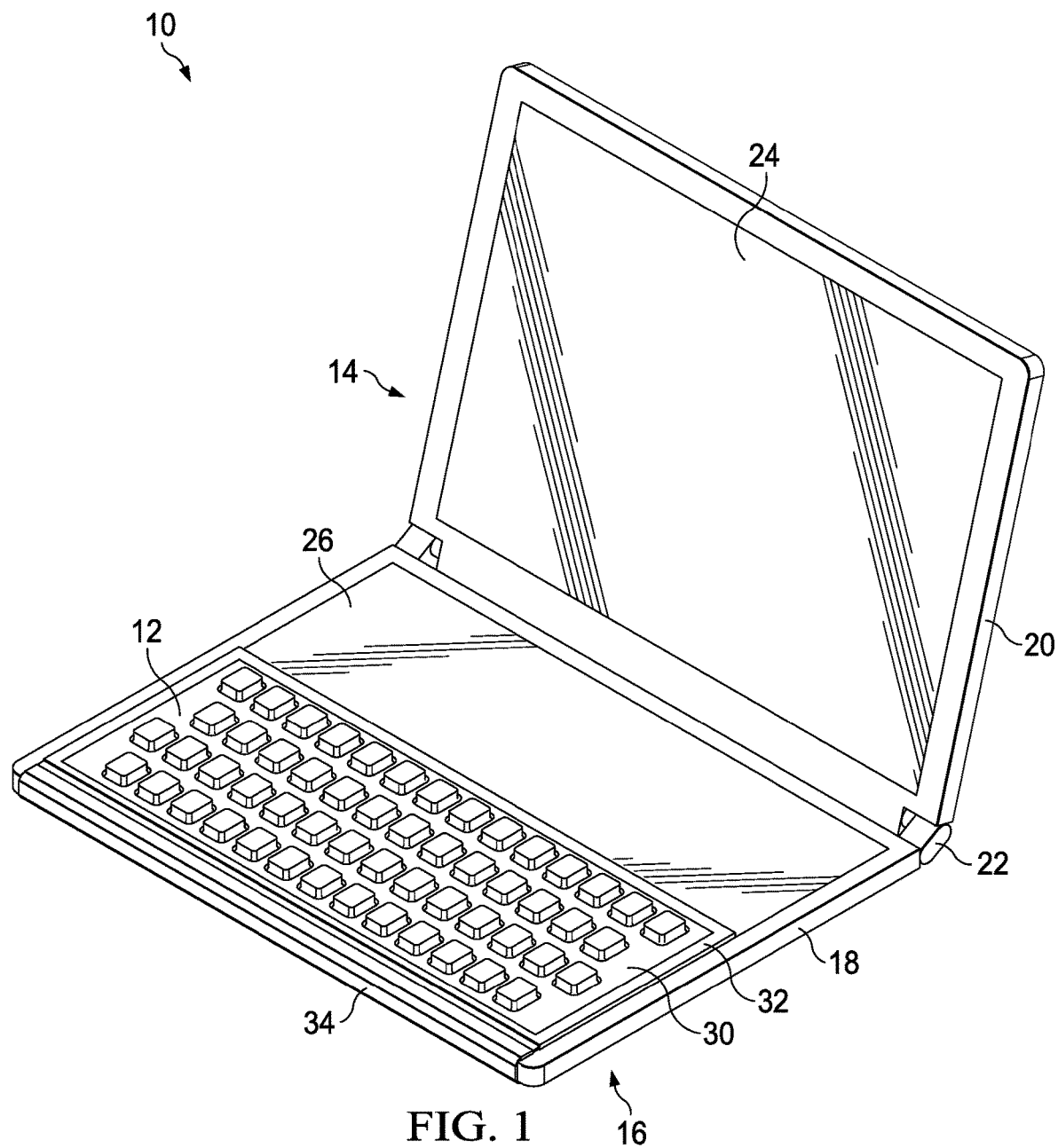
FIG. 1 depicts a side perspective view of an information handling system in an open configuration having a keyboard rested over a touchscreen display to accept key inputs by an end user.

Referring now to FIG. 1, a side perspective view depicts an information handling system 10 in an open configuration having a keyboard 12 rested over a touchscreen display 14 to accept key inputs by an end user. In the example embodiment, information handling system 10 has a portable housing 16 with a main housing portion 18 rotationally coupled to a lid housing portion 20 by a hinge 22. Main housing portion 18 rests on a support surface, such as a desktop, in a horizontal disposition to act as a base for lid housing portion 20, which rotates approximately 90 degrees to a vertical disposition commonly referred to as a clamshell configuration. Touchscreen display 14 has a lid display portion 24 in lid housing portion 20 and a main display portion 26 in main housing portion 18, which may be separate display elements or a single display element, such as an OLED film that extends from lid housing portion 20 to main housing portion 18 across hinge 22. Conventional "clamshell" or convertible information handling systems typically have a mechanical keyboard integrated in main housing portion 18. In contrast, the example embodiment has a touchscreen display across the inside surface of housing 16 that an end user may fold to a tablet configuration so that the entire surface presents visual images. In the clamshell configuration as shown by FIG. 1, the end user may make typed inputs by typing at a visually-depicted keyboard at main display portion 26; or the end user may place keyboard 12 over main display portion 26 to make key inputs.

In the example embodiment, keyboard 12 has plural keys 28 disposed in conventional QWERTY configuration and having a raised vertical position relative to a lattice 30 that supports keys 28. An end user makes a typed input by pressing downward on a key 28 so that the key touches touchscreen display 14. A touch controller detects key touches and assigns input values based upon the key touch location. Keys 28 have an upward bias applied so that, after a downward press, the key returns to a raised vertical position to accept an additional input. In the example embodiment, keyboard 12 has a frame 32 about its outer periphery that supports lattice 30 and integrates with a cover 34, which fits around the outside surface of housing 16. Frame 32, lattice 30 and keys 28 interact to adjust the vertical position of keys 28 relative to lattice 30 between a raised input configuration and a lowered cover configuration that protects housing 16 without key 28 movement. Lattice 30 is essentially openings defined in a plane through which keyboard keys extend. In an alternative embodiment, cover 34 may have a reversed configuration so that keyboard 12 rests on lid display portion 24. That is, information handling system 10 has a housing 16 that allows either housing portion 18 or 20 to act as a base or viewing portion.

Figure 2:
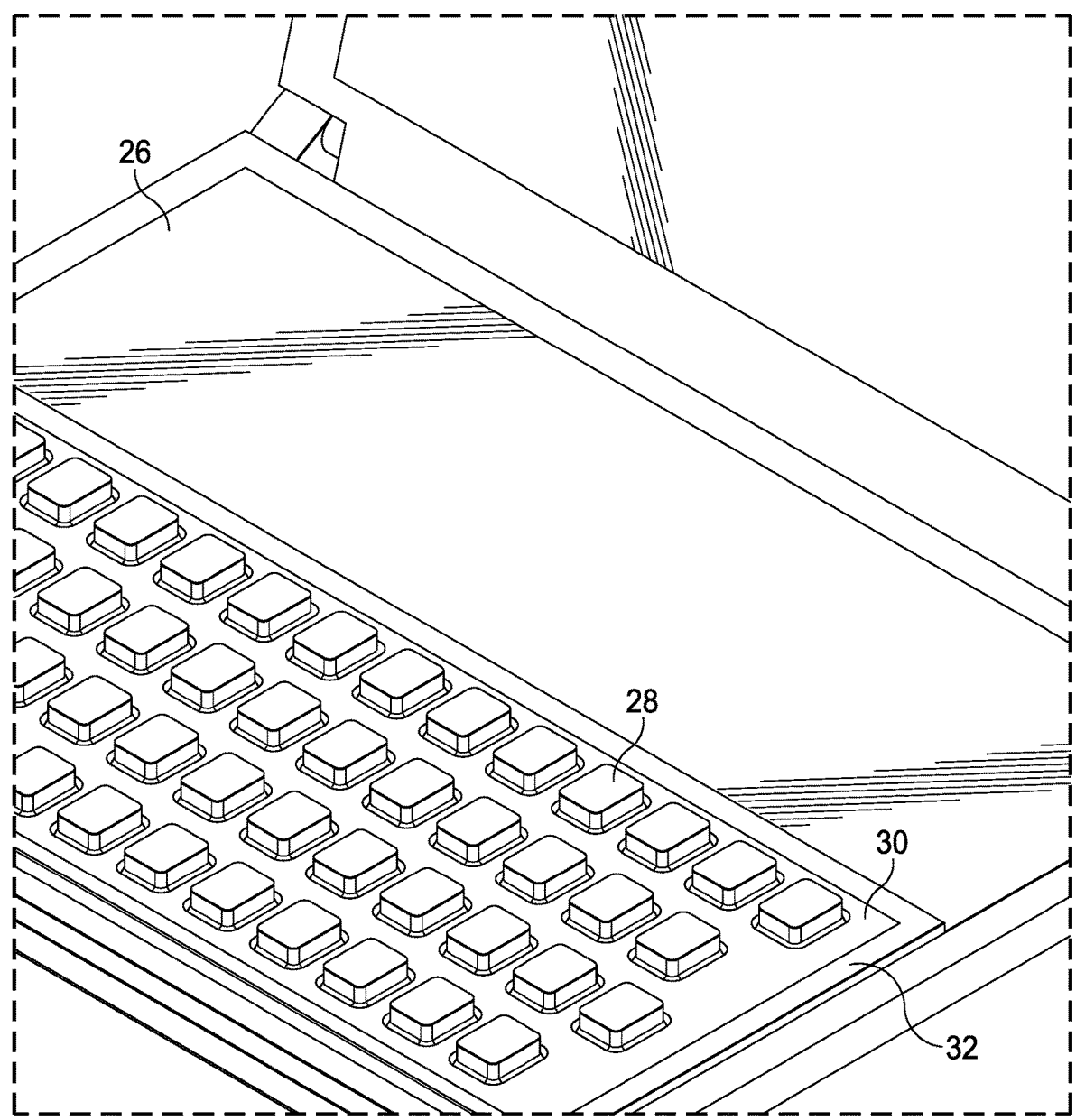
FIG. 2 depicts a close-up side perspective view of keys in a raised position with the lattice pressed downward to contact the main display portion.

Referring now to FIG. 2, a close-up side perspective view depicts keys 28 in a raised position with lattice 30 pressed downward to contact main display portion 26. Pressing downward on lattice 30 translates an upward bias to keys 28 that raises keys 28 above frame 32 for ready access by an end user. As is set forth below in greater detail, various relationships between keys 28, lattice 30 and frame 32 may change the amount of vertical motion of keys 28 needed to touch display 26, the amount of bias trending key 28 upwards and the relative height of key 28 to frame 32 in the extended and withdrawn configurations.

Figure 3:
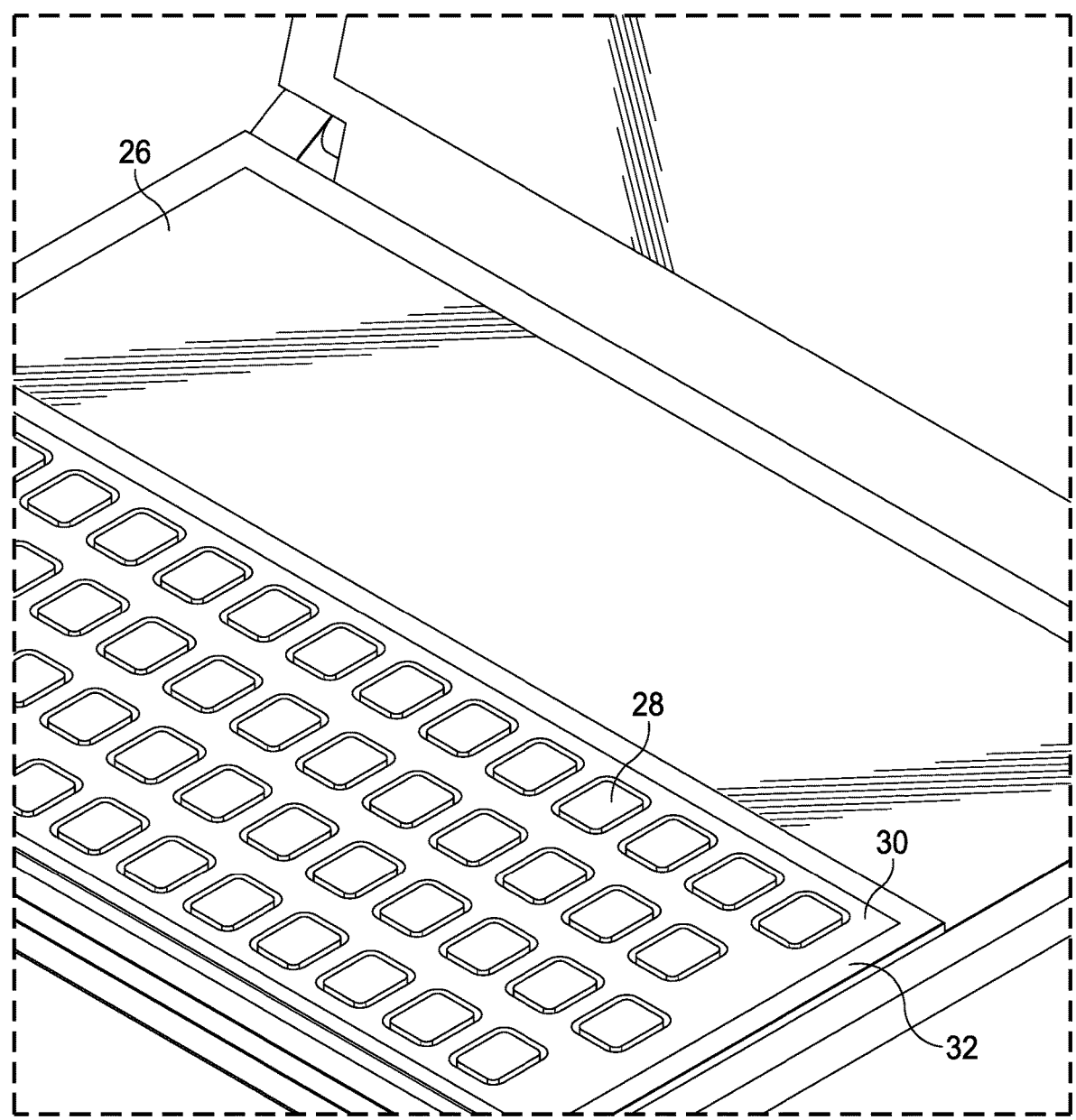
FIG. 3 depicts a close-up side perspective view of keys in a lowered position with lattice raised above the main display portion.

Referring now to FIG. 3, a close-up side perspective view depicts keys 28 in a lowered position with lattice 30 raised above the main display portion 26. In the example embodiment, keys 28, lattice 30 and frame 32 have substantially the same height above display 26. Unless lattice 30 is pressed downward, keys 28 bias to a level height with lattice 30 and frame 32. In part, the tendency to assume a level surface may result from manufacture by injection molding of keyboard 12 with an elastic thermoplastic in the level configuration. In alternative embodiments, other types of neutral configurations may be selected. The example neutral configuration provides a cover with an even surface where the keyboard is used to cover information handling system 10. As is described in greater detail below, pressing downward on lattice 30 overcomes the natural configuration to maintain lattice 30 in contact against display portion 26, thus raising keys 28 as depicted in FIG. 2. For example, lattice 30 is maintained in contact against display portion 26 with magnetic attraction.

Figure 4:
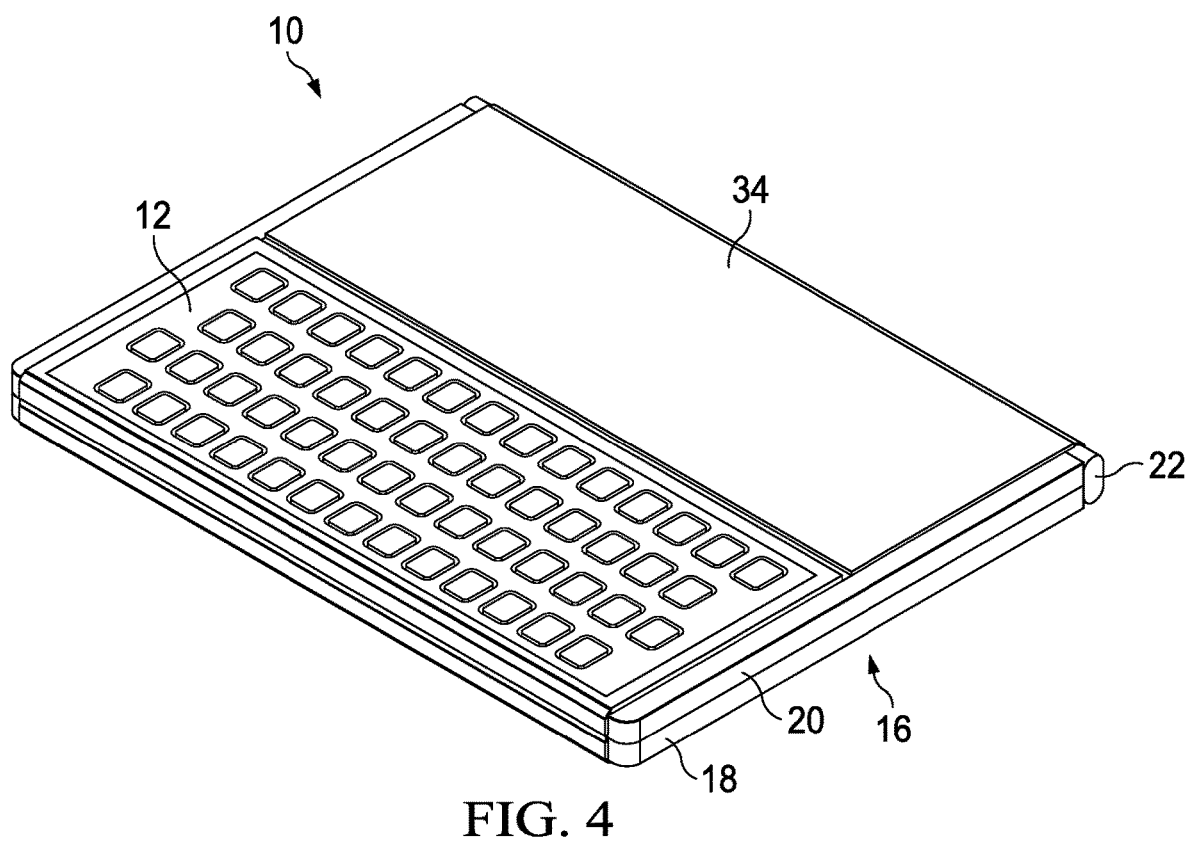
FIG. 4 depicts a side perspective view of an information handling system with a cover wrapped around the outer surface of housing.

Referring now to FIG. 4, a side perspective view depicts information handling system 10 with cover 34 wrapped around the outer surface of housing 16. Cover 34 is, for example, a resilient elastic thermoplastic material that protects against impacts to housing 16. Keyboard 12 is integrated in cover 34 at one end so that, to open information handling system 10 from the depicted closed configuration, keyboard 12 is lifted away from housing 16 to allow rotation of housing portions 18 and 20 relative to each other. In one embodiment, keyboard 12 may rotate 180 degrees to couple to the bottom surface of housing portion 20, such as by coupling to the bottom surface with magnetic attraction.

Figure 5:
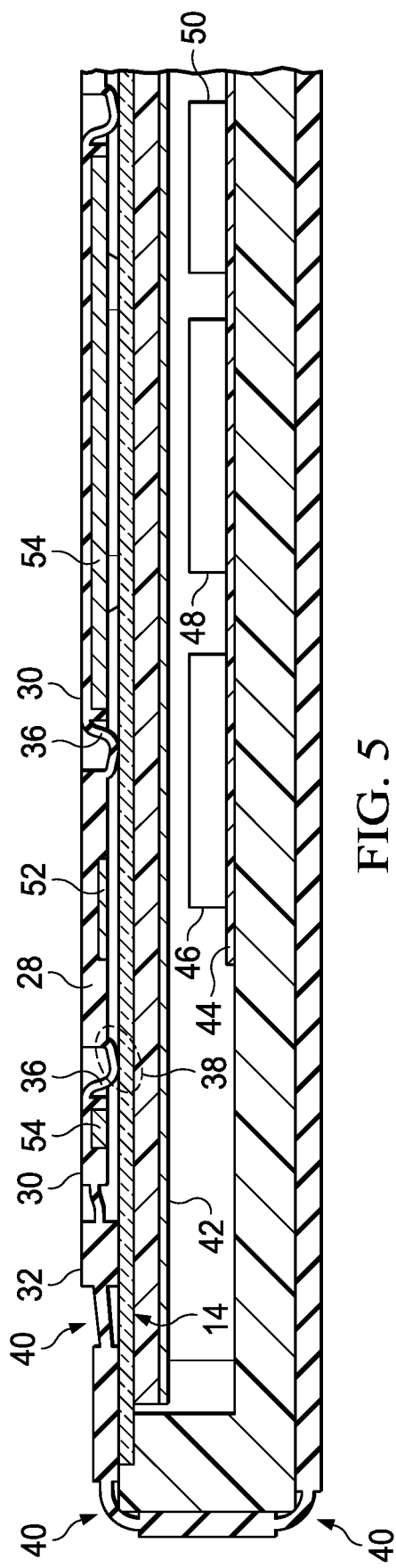
FIG. 5 depicts a side cutaway view of a portable information handling system having a keyboard resting on a touchscreen display to accept key inputs with keys in a withdrawn position.

Referring now to FIG. 5, a side cutaway view depicts portable information handling system 10 having keyboard 12 resting on a touchscreen display 14 to accept key inputs with keys 28 in a withdrawn position. In the example embodiment, keyboard 12 and frame 32 rests on touchscreen display 14 to support lattice 30 in a raised position above touchscreen display 14. The upper surface of frame 32, lattice 30, and key 28 have a common plane that presents as a cover 34 to an end user. Key 28 is spaced by a distance from lattice 30 on all sides so that key 28 moves vertically within the opening formed by lattice 30. An elastic member 36 couples lattice 30 to key 28 across the opening with the elastic member having a length [IA] greater than the distance between lattice 30 and key 28. For example, elastic member 36 is formed from an elastomer with injection molding as a contiguous piece with lattice 30 and key 28. In one embodiment, elastic member 36 integrates other resilient materials, such as with a double shot injection or insertion of a metal piece or other resilient member. The excess length of elastic member 36 forms a bend 38 that rests against touchscreen display 14 to help support key 28 in the withdrawn position as shown. In the example embodiment, a motherboard 44, central processing unit (CPU) 46, random access memory 48 and keyboard controller 50 are depicted that cooperate to process information. In alternative embodiments, various configurations of processing components may be included to process information, as is understood in the art.

Lattice 30 integrates plural magnets 54 that create magnetic attraction to a steel plate 42 or other ferromagnetic material disposed under touchscreen display 14. In the withdrawn configuration depicted by FIG. 1, the bottom surface of lattice 30 is raised over the top of touchscreen display 14 so that magnets 54 are held distal from contact against touchscreen display 14. In the example embodiment, resting keyboard 12 on touchscreen display 14 does not create sufficient attractive force to pull lattice 30 downward and into contact with touchscreen display 14. To get lattice 30 into contact with touchscreen display 14, some downward pressing force has to be applied so that magnets 54 generate sufficient magnetic attraction to pull lattice 30 downward and into contact with touchscreen display 14. The static resistance of lattice 30 that maintains the depicted withdrawn configuration of keys 28 above touchscreen display 14 when frame 32 rests on touchscreen display 14 may be adjusted by the selection of material and dimensions of elastic member 36. In the example embodiment, plural creases 40 are formed in the cover 34 to selectively fold cover 34 over housing portions 18 and 20 depending upon the configuration of cover 34. As depicted, the crease 40 closest to keyboard 12 is planar with keyboard 12 and the next crease provides a fold of cover 34 around main housing portion 18. When housing portions 18 and 20 rotate to a closed position, the crease closest to keyboard 12 folds to adjust to the height to the combined housing portions and cover the outsides surface of lid housing portion 20 with keyboard 18 as depicted by FIG. 4.

Figure 6:
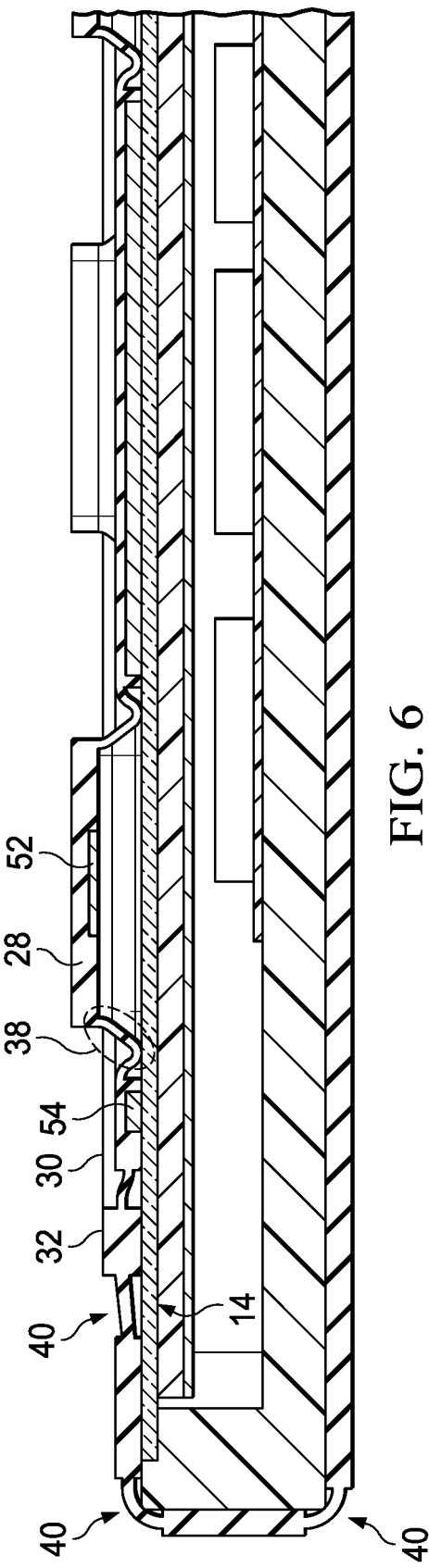
FIG. 6 depicts a side cutaway view of a portable information handling system having a keyboard resting on a touchscreen display to accept key inputs with keys in a raised position.

Referring now to FIG. 6, a side cutaway view depicts portable information handling system 10 having a keyboard 12 resting on a touchscreen display 14 to accept key inputs with keys 28 in a raised position. In the example embodiment, a press down against lattice 30 overcomes the upward bias that maintains lattice 30 a spaced distance above touchscreen display 14 so that magnets 54 pull lattice 30 into contact with touchscreen display 14 and maintains lattice 30 in contact with touchscreen display 14. As lattice 30 moves downward, elastic member 36 deforms to straighten bend 38 somewhat, translating the movement of lattice 30 into an upward movement of key 28. Key 28 extends under the influence of elastic member 36 to a raised position that an end user can interact with to type inputs. A conductive material 52 located in key 28 enhances the interaction of key 28 as it comes into proximity with touchscreen display 14 by increasing the capacitive detection. Elastic member 36 flexes in response to an end user press downward on key 28 to provide downward movement and an upward bias upon release of key 28. Bend 38 engages against touchscreen display 14 to provide upward bias and leverage to return key 28 to a raised position after end user release. Once keyboard 12 is lifted off touchscreen display 14, keys 28 retract to the withdrawn location indicated by FIG. 5.

Figure 7:
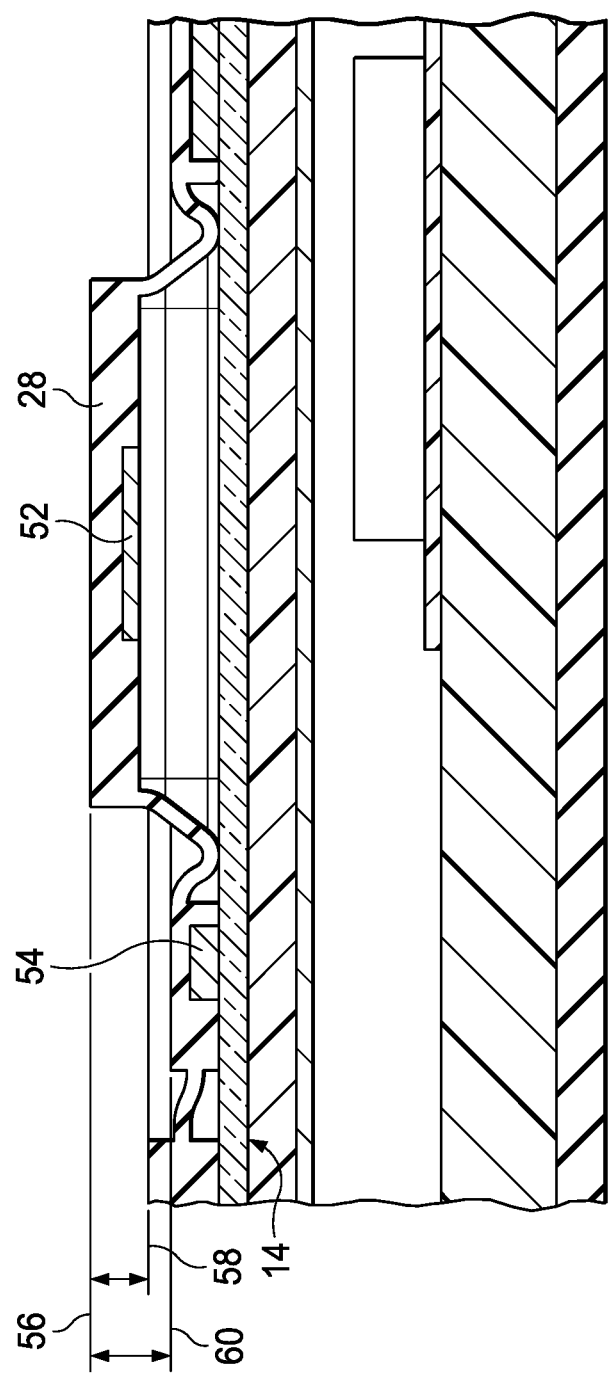
FIG. 7 depicts a side cutaway view of an example of height relationships of the key and lattice in withdrawn and extended key configurations.

Referring now to FIG. 7, a side cutaway view depicts an example of height relationships of key 28 and lattice 30 in withdrawn and extended key configurations. Key 28 is raised relative to touchscreen display 14 to an extended position that accepts inputs by elastic member 36. The height 56 in the raised position is above the height 58 of the withdrawn position by an amount dependent upon the length of elastic member 36 relative to the distance between key 28 and lattice 30. The height 58 is a neutral height at which key 28 and lattice 30 align within the same plane as frame 30 when a downward bias is not placed on lattice 30. The downward movement of lattice 30 is shown by height 60 below height 58. As is evident from heights 56 through 60, a smaller movement of lattice 30 provides a greater movement of key 28 by the action of the elastic member. In various embodiments, keyboard characteristics may be varied to provide desired heights by varying the interaction of elastic member 36 between lattice 30 and key 28.

Although the present invention has been described in detail, it should be understood that various changes, substitutions and alterations can be made hereto without departing from the spirit and scope of the invention as defined by the appended claims.

What is claimed is:

1. An information handling system comprising:
   first and second housing portions rotationally coupled to each other;
   processing components disposed in the first and second housing portions, the processing components cooperating to process information;
   a first touchscreen display disposed at an upper surface of the first housing portion;
   a second touchscreen display disposed at an upper surface of the second housing portion; and
   a keyboard rested on the first touchscreen display, the keyboard having a frame, a lattice and plural keys disposed in the lattice, each key coupled to the lattice by an elastic material, the elastic material having a length greater than the distance between the key and the lattice to form a bend,
   wherein the frame supports the keyboard with contact against the first touchscreen display, the lattice selectively supports the keyboard with contact against the first touchscreen display, and the bend raises the keys to an extended position if the lattice contacts against the first touchscreen display.

2. The information handling system of claim 1, further comprising
   one or more magnets integrated in the lattice; and
   a ferromagnetic material disposed under the first touchscreen display,
   wherein the one or more magnets bias the lattice towards the first touchscreen display.

3. The information handling system of claim 2,
   wherein the bend contacts against the first touchscreen display when the lattice is raised above the first touchscreen display to bias the lattice away from the first touchscreen display.

4. The information handling system of claim 3,
   wherein the bend retracts the keys unless the lattice is pressed towards the first touchscreen display so that the one or more magnets engage the ferromagnetic material to maintain the keys in an extended position.

5. The information handling system of claim 4, further comprising:
   a capacitive element integrated in each key to enhance touch detection of each key against the first touchscreen display.

6. The information handling system of claim 1,
   wherein the keyboard integrates in a cover that removably couples around both the first and second housing portions in a closed configuration, the keys retained in a retracted position in the closed configuration.

7. The information handling system of claim 6,
   wherein the cover includes a crease located proximate the keyboard to fold over the first housing portion when the second housing portion rotates distal the first housing portion.

8. The information handling system of claim 7,
   wherein the keyboard selectively folds under the first housing portion to expose the first touchscreen display, the keyboard maintained proximate a bottom side of the housing by magnetic attraction.

9. The information handling system of claim 8,
   wherein the first and second touchscreen displays comprise one contiguous OLED film.

10. A keyboard comprising:
    a frame having a height and a bottom surface configured to rest on a support surface;
    a lattice disposed in the frame and having a height of less than the frame height, the lattice having plural openings;
    a key disposed in each lattice opening and configured to move vertically; and
    an elastic material coupling each key to the lattice, the elastic material having a length greater than a distance between the key and lattice to form a bend, the bend pressing against the support surface to raise the lattice above the support surface, the elastic material responding to movement of the lattice towards the support surface by extending the keys vertically above the frame.

11. The keyboard of claim 10, further comprising:
    magnets integrated in the lattice,
    wherein the magnets interact with a ferromagnetic material of the support surface to maintain the keys in a raised position.

12. The keyboard of claim 11,
    wherein the support surface comprises a touchscreen display having a steel support plate.

13. The keyboard of claim 12, further comprising:
    a cover coupled at one and extending a distance that wraps around an information handling system.

14. The keyboard of claim 13,
    wherein the cover includes a first crease at a first distance from the keyboard to fit around the information handling system housing in a closed configuration, and
    a second crease at a second distance from the keyboard to fit around the information handling system housing in an open configuration.

15. A method for making keyboard inputs at a portable information handling system, the method comprising:
    placing the keyboard on a touchscreen display;
    retaining keys of the keyboard in a withdrawn position on the keyboard;
    pressing on a lattice of the keyboard towards the touchscreen display, the lattice moving vertically from a position raised above the touchscreen display to contact with the touchscreen display;

applying the lattice movement to bias the keys from the withdrawn position to an extended position; and retaining the lattice in contact with the touchscreen display by magnetic attraction.

16. The method of claim 15, further comprising:

pressing on keys to overcome the bias from the extended position to touch the touchscreen display with the keys; and assigning input values based upon a position of the touchscreen display touched by the keys.

17. The method of claim 16, further comprising:

enhancing key touch detection with conductive material disposed under each key.

18. The method of claim 16, further comprising:

integrating the keyboard in a cover;

closing housing portions of the information handling system to hide the touchscreen display; and wrapping the cover around the housing portions.

19. The method of claim 16, wherein the retaining keys of the keyboard in a withdrawn position further comprises:

coupling each key to the lattice with an elastic material having a length greater than the distance between the key and the lattice to form a bend; and biasing the lattice upwards away from the touchscreen display by contact of the bend against the touchscreen display.

20. The method of claim 19, wherein the applying the lattice movement to bias the keys further comprises:

translating lattice movement through the bend to raise each key; and extending each key vertically raised above the lattice.

* * * * *